United States Patent
Ishinaga

[11] Patent Number: 5,936,264
[45] Date of Patent: Aug. 10, 1999

[54] MOUNTING TECHNIQUE FOR A CHIP LIGHT EMITTING DEVICE

[75] Inventor: Hiroki Ishinaga, Kyoto, Japan

[73] Assignee: Rohm Co., Ltd., Kyoto-shi, Japan

[21] Appl. No.: 08/968,420

[22] Filed: Nov. 12, 1997

[30] Foreign Application Priority Data

Nov. 15, 1996 [JP] Japan .................................. 8-304810

[51] Int. Cl.[6] .................................................. H01L 33/00
[52] U.S. Cl. ............................................ 257/99; 257/100
[58] Field of Search ................................. 257/91, 98, 99, 257/100, 669

[56] References Cited

U.S. PATENT DOCUMENTS 5,475,241 12/1995 Harrah et al. .............................. 257/99

Primary Examiner—Minh Loan Tran
Attorney, Agent, or Firm—Nikaido, Marmelstein, Murray & Oram LLP

[57] ABSTRACT

A chip light emitting device is disclosed. A light emitting chip (LED chip) has overlying semiconductor layers to have a light emitting layer defined between the semiconductor layers. End electrodes are oppositely formed on surfaces of the semiconductor layers in a manner sandwiching the light emitting layer. A substrate has a main surface mounted with the light emitting chip. Terminal electrodes are formed at respective end portions of the substrate. The terminal electrodes is respectively in electrical connection with the end electrodes. The light emitting chip is in a rectangular parallelepiped form so that the light emitting layer thereof assumes in contour a rectangle shape having longer and shorter sides. The light emitting chip is fixed on the substrate in a position that the longer side of the light emitting layer is placed in parallel to the main surface of the substrate. The chip light emitting device obtained is satisfactorily thin in thickness due to the height with respect to the main surface of the substrate is held low without reducing the area of the light emitting layer.

5 Claims, 4 Drawing Sheets

MOUNTING TECHNIQUE FOR A CHIP LIGHT EMITTING DEVICE

FIELD OF THE INVENTION

This invention relates to a chip light emitting device adapted for use as a light source for illumination or indication provided in a portable electronic apparatus such as a mobile telephone, a PHS, etc. More particularly, this invention relates to a thin chip light emitting device provided with a light emitting chip bonded on an insulating substrate thereof, wherein the height from the surface of the substrate is reduced.

BACKGROUND OF THE INVENTION

As the size of the portable electronic apparatuses involving mobile telephones and the PHSs (personal handyphone systems) becomes smaller, a demand has been raised for reducing the weight, the thickness and the size for a light emitting device used therefor. In particular, there has been a recent demand for obtaining a thin, low-height, chip light emitting device.

The chip light emitting device of this kind, that is made small and thin, includes a substrate 1, as shown in FIG. 5(a). The substrate 1 is formed with terminal electrodes 2, 3 at opposite ends, one of which electrodes 2 has a portion mounted with a light emitting diode (hereinafter referred to as "LED") chip 4 through die-bonding. The LED chip 4 has a bottom electrode directly connected with the terminal electrode 2 and a top electrode wire-bonded to the other terminal electrode 3 through a gold wire 7, thus providing respective electrical connections between the LED chip 4 and the terminal electrodes 2, 3.

The LED chip 4 has, for example, an n-type semiconductor layer 41 and a p-type semiconductor layer 42 which are formed of GaAs or GaP to have a pn junction plane (or light emitting layer) 43 defined therebetween. The LED chip 4 has opposite surfaces respectively provided with end electrodes 44, 45. The substrate 1 encapsulated at its main surface by a transparent or milk-white epoxy resin so as to cover the LED chip 4, the gold wire 7, etc. for their protections.

The LED chip 4 has its size, i.e. the depth A and the width B respective of which are in dimension of approximately 0.24–0.35 mm. The chip 4 also has its thickness T in dimension equivalent to the depth and the width, i.e. made almost in a cubic form. These depth A and the width B are generally determined to an equal length to each other, in order to facilitate wire-bonding with using a gold as well as provide evenness in brightness of the light to be emitted. Moreover, if the one or both of the dimensions of the depth and the width is taken smaller than the value stated above, the resulting area of the pn junction plane 43 is also decreased. In such a case, however, if an amount of current supply to the reduced area of the pn junction plane is increased in order to increase the amount of light emission from the limited light emitting area of the chip, there is a fear that the semiconductor layers undergo serious injury or accelerated deterioration. It is therefore difficult, in reducing the area of the pn junction plane 43, to provide a required amount of light emission. In the meanwhile, if the thickness T is reduced, the wafer before dicing is liable to warp or distort, making it difficult to provide a uniform quality to the LED chip. Accordingly, the size reduction of the LED chip is limited in thickness to the aforementioned cubic form.

As stated above, it is practically difficult for the conventional chip light emitting device to make further compact, because its LED chip is now on the lower limit of size due to the necessity of providing a required area to the light emitting layer thereof. However, as the mobile telephone or the PHS becomes more compact, there is a further demand for reducing the size of electronic components or parts. In particular, the thinning of thickness is now demanded especially for the chip light emitting device.

SUMMARY OF THE INVENTION

It is therefore the object of the present invention to provide a chip light emitting device having a light emitting layer with an area sufficient for providing a required amount of light emission, which is made thin by using a light emitting chip without being encountered by inconvenience caused by the thickness of the chip during the manufacture of the device.

In accordance with the present invention, there is provided a chip light emitting device comprising:

a light emitting chip having overlying semiconductor layers to have a light emitting layer defined between the semiconductor layers;

end electrodes oppositely formed on surfaces of the semiconductor layers in a manner sandwiching the light emitting layer;

a substrate having a main surface mounted with the light emitting chip;

terminal electrodes formed at respective end portions of the substrate, the terminal electrodes being respectively in electrical connection with the end electrodes;

wherein the light emitting chip is in a rectangular parallelepiped form so that the light emitting layer thereof assumes in contour a rectangle shape having longer and shorter sides; and the light emitting chip being fixed on the substrate in a position that the longer side of the light emitting layer is placed in parallel to the main surface of the substrate.

Here, the light emitting layer means a region here electrons and holes are recombined to create light, involving a pn junction plane defined between a p-type layer and an n-type layer and its vicinity or an active layer sandwiched between a p-type layer and an n-type layer.

With such a structure, the light emitting layer is provided to be long in a direction parallel to the width of the substrate in which a margin is comparatively sufficiently left but low in its height from the main surface of the substrate. Thus, the light emitting device can be made low in height while keeping a required area for the light emitting layer. The chip light emitting device obtained is low in height and can provide a required amount of light emission without increase of the electric current supplied.

Preferably, the end electrode of the light emitting chip and the terminal electrode of the substrate are directly connected through a conductive adhesive. By so constructing, there is no necessity of providing a space for performing wire-bonding with using a gold wire or the like, achieving further thinning of the device.

More preferably, the light emitting chip fixed on the substrate is in a rectangular parallelepiped form having a height of not greater than 0.2 mm with respect to the main surface of the substrate. With such a structure, it is possible to provide a device that has a thickness of not greater than 0.5 mm between the back surface of the substrate and a top surface of the package.

The above described objects and other objects, features, aspects and advantages of the present invention will become more apparent from the following detailed description of the present invention when taken in conjunction with the accompanying drawings.

DETAILED DESCRIPTION

Figure 1:
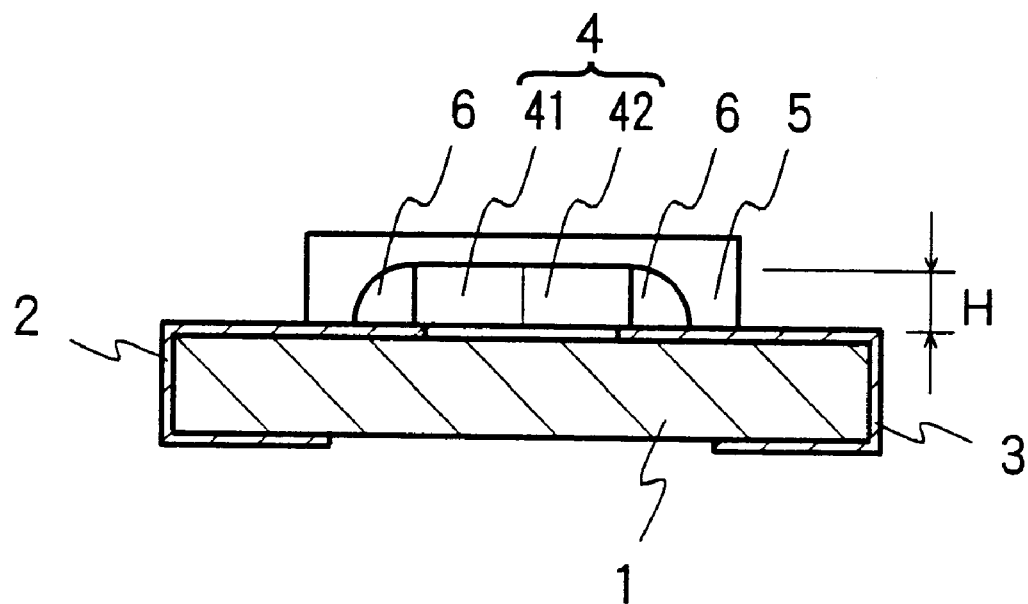
FIG. 1(a) to FIG. 1(b) are respectively a sectional view and a plan view of a chip light emitting device according to one embodiment of the present invention.
Figure 1:
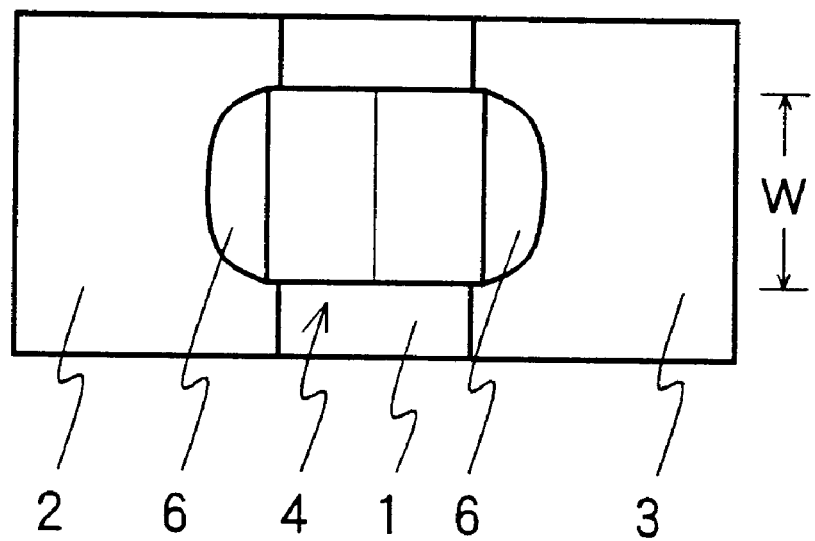

Referring to FIGS. 1(a) and (b), there is illustrated respectively a longitudinal sectional view and a plan view of a chip light emitting device structure according to the present invention, wherein a resin-molded package is omittedly shown in the plan view. That is, the chip light emitting device includes a substrate 1 for mounting with an LED chip 4 thereon. The substrate 1 has, at opposite ends, terminal electrodes 2, 3 respectively extending to the backside of the substrate 1. The LED chip 4 is formed by overlaying semiconductor layers 41, 42 having respective end electrodes which are in electrical connection with the terminal electrodes 2, 3 through a conductive adhesive 6, 6. The conductive adhesive 6, 6 is of a solder paste or a silver paste. The LED chip 4 is encapsulated by a transparent epoxy resin 5 on the substrate 1 to allow the light emitted from the LED chip to be transmitted therethrough.

The substrate 1 is formed of an insulating material that has a glass cloth impregnated with a BT (bismaleimide-triazine) resin. The substrate 1 is in a size of approximately a 0.8 mm length by a 1.6 mm width and a thickness of approximately 0.1 to 0.2 mm, because of the requirement of compactness for the chip light emitting device. In practice, the undivided substrate having a size for example of 10 cm by 5 cm is subjected to processing of forming in a matrix form a multiplicity of light emitting devices thereon. The multiplicity of light-emitting devices formed are finally divided by breaking the substrate into individual light emitting devices.

The terminal electrodes 2, 3 are formed on the undivided substrate 1 at their main and back surfaces for example by screen-printing a silver paste onto these surfaces, followed by curing the printed paste. On this occasion, the undivided substrate is formed with a plurality of slits at portions corresponding to side faces of chips to be formed so that adjacent chips are positioned in one direction through the slit provided therebetween. Accordingly, during applying the paste to the main and back surfaces, the paste is at the same time applied also to the side faces of the slit. In this manner, the terminal electrodes 2, 3 are formed in a manner they each extend bridging between the main and back surfaces through the side face.

Figure 2:
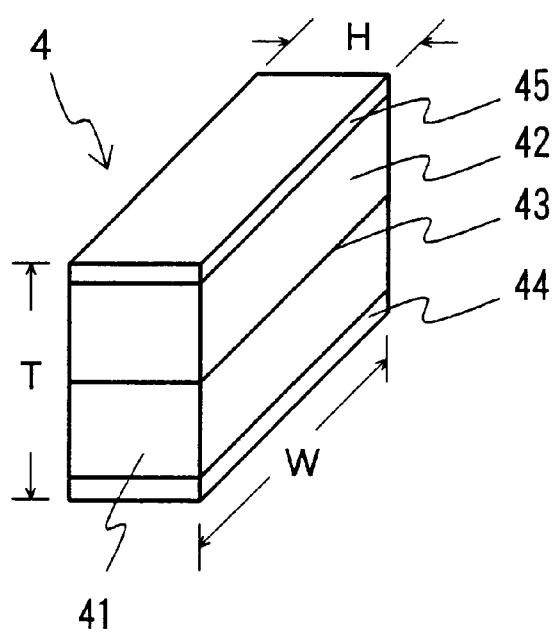
FIG. 2(a) to FIG. 2(b) are respectively a magnified perspective view of an LED chip for use in the device FIG. 1 and a plan view in a wafer form for forming the LED chip.
Figure 2:
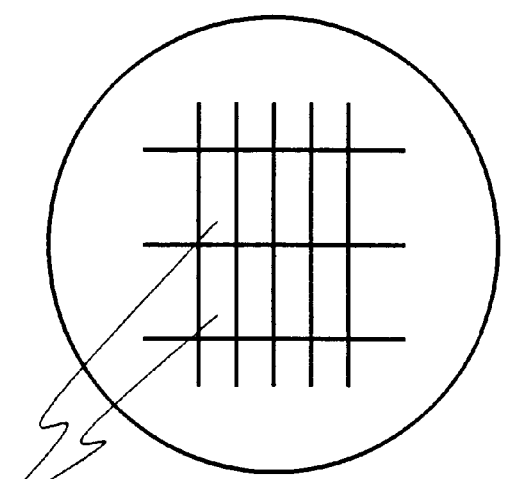

The LED chip 4 comprises two overlaying semiconductor layers, that is, an n-type semiconductor layer 41 and a p-type semiconductor layer 42, as shown in a perspective view of FIG. 2(a). These semiconductor layers 41, 42 have a p-n junction plane 43 defined therebetween which plane constitutes a light emitting layer at a boundary thereof. The semiconductor layers 41, 42 have their respective n-side and p-side electrodes (hereinafter refered to as end electrodes) 44, 45 formed by a conductive metal or the like.

The LED chip 4, for the chip light emitting device of the present invention, is formed in a rectangular parallelepiped form so that it has a light emitting layer in a rectangle form as shown in FIG. 2(a). Consequently, the LED chip 4 is mounted on the substrate 1 such that a shorter side H of the chip extends in a direction perpendicular to the main surface of the substrate 1 while a longer side W thereof extends in parallel to the substrate main surface, as shown in FIGS. 1(a) and 1(b). In the formation of the rectangular parallelepiped LED chip 4, the pn junction and the end electrodes 44, 45 are formed in a state of a wafer, and then cut grooves are formed by dicing in line and row directions such that the groove pitch is taken different between the line direction and the row direction. The aforesaid end electrodes 44, 45 are formed by vacuum-depositing gold or the like, prior to carrying out the dicing process.

The shorter side H of the LED chip 4 is determined to a length approximately 0.17–0.2 mm, while the longer side W is approximately 0.4–0.55 mm. The thickness T is determined approximately 0.2–0.3 mm, which is almost equivalent to the thickness for the conventional structure. By doing so, even if one side of the light emitting layer in the rectangle form is made horter, it is possible to determine constant the area of he pn junction plane 43 as the light emitting layer by increasing the length of the other side. In this manner, the area of the pn junction plane 43 can be secured almost equivalent to that of the squared plane for the conventional cubic chip structure, which can emit almost the equivalent amount of light to that of the conventional structure by supplying the equivalent amount of current thereto.

The LED chip 4 of the invention is made in a rectangular parallelepiped form to be mounted at a position extending long sideways on the substrate 1, so that the end electrodes 44, 45 thereof are directly fixed through the conductive adhesive 6 to the respective terminal electrodes 2, 3 of the substrate 1. This, accordingly, eliminates the necessity of implementing wire-bonding to be performed between the end electrode of the LED chip and the terminal electrode of the substrate.

Incidentally, the LED chip 4 is not limited to the structure having the pn junction as stated above, it may be constructed in such a structure that an active layer is sandwiched between a p-type layer and an n-type layer.

In the present invention the LED chip is made in the rectangular parallelepiped form to be mounted at a position extending long sideways on the substrate, as stated above. Therefore, it is possible to make the chip to be long in a width direction of the substrate in which comparatively sufficient margin is left, with the height thereof from the main surface of the substrate 1 kept low. This structure can provide a sufficient area to the light emitting layer for emitting light. To this end, the chip light emitting device is made sufficiently thin with its height kept low, but it can emit a sufficient amount of light without increasing the amount of electric current supplied. Thus, the chip light emitting device is thin in structure but satisfactory in electric characteristics.

Furthermore, since the electrical connection between the end electrode of the LED chip 4 and the terminal electrode 2, 3 of the substrate 1 is done in a direct contact form through a conductive adhesive such as a solder, or a silver paste. Therefore, there is no necessity of implementing wire-bonding for connecting between these electrodes, making possible to reduce the height or thickness of the device.

Figure 3:
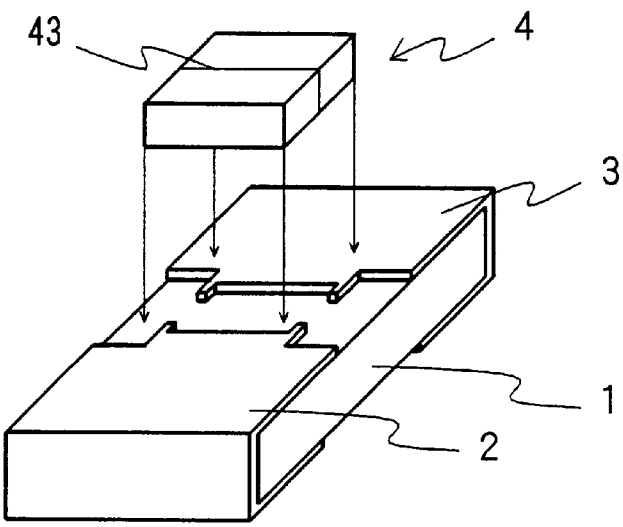
FIG. 3(a) to FIG. 3(c) are perspective views owing the process for manufacturing the device of FIG. 1(a)
Figure 3:
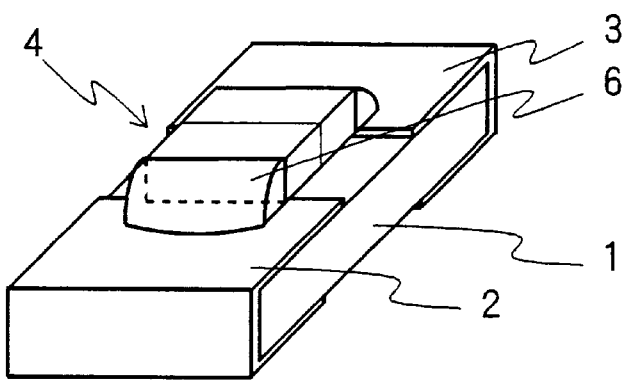
Figure 3:
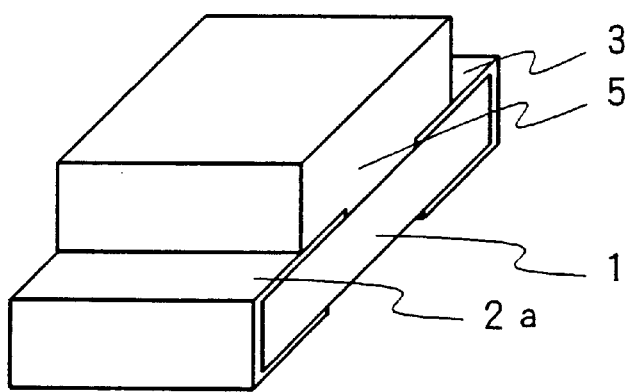

The method of manufacturing the chip light emitting device as shown in FIG. 1(a) will now be explained with reference to FIG. 3(a) to FIG. 3(c) showing the manufacturing process. Incidentally, although only one LED chip and substrate is demonstrated in the figure, in actual practice the LED chips and the substrates are manufactured in batch using a large-sized undivided substrate. That is, divided LED chips are placed in a matrix form on a large-sized substrate which is finally divided into individual light emitting devices, as mentioned before.

First, a silver paste or the like is screen-printed onto the main and back surfaces of a large-sized undivided substrate 1 formed with slits penetrating the substrate, and the printed paste is then cured. Thus, terminal electrodes 2, 3 are formed so that they each extend bridging between the main surface and the back surface of the substrate through a side face exposed by the slit, as shown in FIG. 3(a).

Separately from the substrate, LED chips 4 are prepared in a wafer form by forming a p-type semiconductor layer 42 on an n-type semiconductor layer (i.e. a wafer) 41 to provide a pn junction 43 therebetween, followed by forming electrodes 44, 45. The LED chip 4 is obtained by dividing the wafer thus processed, as shown in FIG. 2(a). The LED chip 4 is placed (in a matrix form) on the substrate by using a suction collet, not shown, as shown in FIG. 3(a). In this case, it is preferred, for facilitating connection, that a solder paste or silver paste is applied onto the end electrode of the LED chip 4 and the terminal electrodes 2, 3. Alternatively, solder bumps may be formed, beforehand, on appropriate portions of these electrodes.

Where mounting the LED chip 4 onto the substrate, suction collet is used which has a suction port larger than a narrower surface of the LED chip 4 but smaller than the wider surface thereof while vibrating LED chips through a vibrating feeder. With such a suction collet, it is possible to pick up only a properly positioned LED chip, i.e. positioned at its broader surface vertical without sucking an improperly directed chip, making possible proper mounting for the LED chip. Incidentally, the electric polarity of the LED chip 4 is specified by conducting an electrical test thereon after encapsulating a package 5. The test result can be marked on the surface of the package in dependence upon electric characteristics, etc. measured in the test.

Then, a solder paste or a silver paste is applied to the surface of the electrodes of the LED chip 4, the surface of the terminal electrodes 2, 3 of the substrate 1, as shown in FIG. 3(b). The solder paste applied is melted by heating, or the solder paste if used is cured, so that the electrodes are placed into electric connection with associated ones of the electrodes, thereby fixing the LED chip 4 on the substrate. Thereafter, the LED chip 4 is encapsulated by a transparent or milk-white epoxy resin to form a package 5, as shown in FIG. 3(c). Thereafter, the large-sized substrate thus processed is cut in a direction perpendicular to the side of the terminal electrode 2, 3 into a chip light emitting device as shown in FIG. 1(a). Note that separation in the side of the terminal electrode 2, 3 is already done by the slit formed through the substrate.

Figure 4:
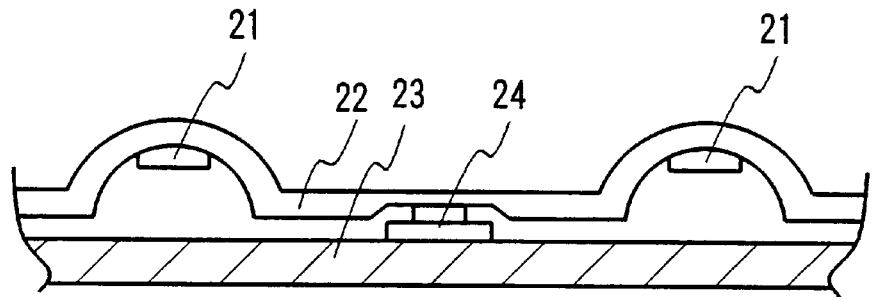
FIG. 4 is a sectional view showing an example to which the chip light emitting device of the invention is applied.
Figure 5:
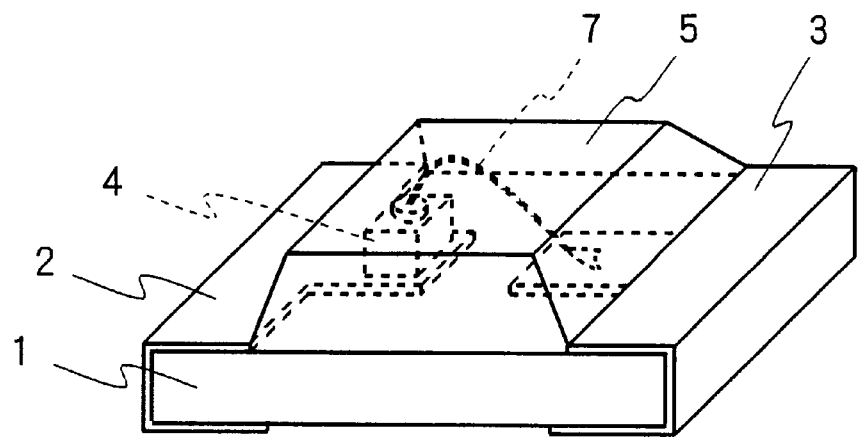
FIG. 5(a) to FIG. 5(b) are respectively perspective views of a conventional chip light emitting device.
Figure 5:
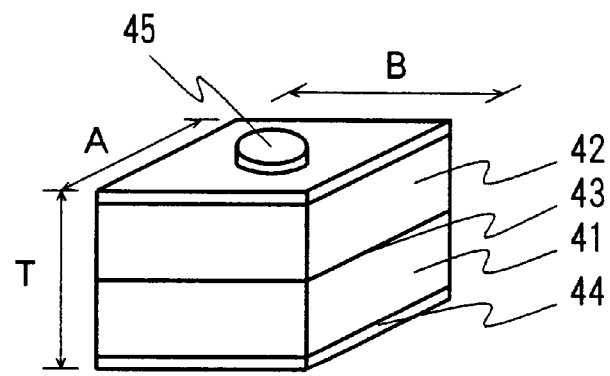

FIG. 4 shows an example to which the chip light emitting device is applied. That is, the figure shows a sectional view of a switch board for a mobile telephone, for example. The board includes switch portions 21 each formed by a push button are provided on a substrate 23. The switch portions 21 are coated over by a switch sheet 22. For illuminating the switch portions 21, a light emitting device 24 is provided as a light source commonly for the two switching portions 21. If the thin-chip light emitting device is employed for this light source, the switch sheet 22 can be made flat, particularly at over the light source, throughout the surface of the switch board. Since no convex is caused due to the presence of the light emitting device, there is no necessity of thickening the portions around the light emitting device in order to provide a fine appearance.

In the present invention, the light emitting chip is formed in a rectangular parallelepiped shape to be long in the width direction so that the resulting device is reduced in height without narrowing the area of the light emitting layer (pn junction plane). Consequently, the thinning of the device thickness is achieved without incurring reduction in the amount of light emission and degradation in the device. Furthermore, since the light emitting chip is mounted at a position horizontally long on the substrate so that the end electrodes of the LED chip are directly connected to the terminal electrodes of the substrate through a conductive adhesive, there is no necessity of the space for implementing wire-bonding, contributing thinning of the device. To this end, it is possible to form the thickness of the chip light emitting device to not greater than 0.5 mm.

By using the chip light emitting device of the invention, a light source for a portable apparatus such as a mobile telephone and a PHS can be provided sufficiently thin, contributing to reduction in weight and size for portable apparatus or devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A chip light emitting device comprising:
   a light emitting chip having overlying semiconductor layers to have a light emitting layer defined between said semiconductor layers;
   end electrodes oppositely formed on surfaces of said semiconductor layers in a manner sandwiching said light emitting layer;
   a substrate having a main surface mounted with said light emitting chip;
   terminal electrodes formed at respective end portions of said substrate, said terminal electrodes being respectively in electrical connection with said end electrodes;
   wherein said light emitting chip is in a rectangular parallelepiped form so that said light emitting layer thereof assumes in contour a rectangle shape having longer and shorter sides; and
   said light emitting chip being fixed on said substrate in a position that the longer side of said light emitting layer is placed in parallel to said main surface of said substrate.

2. A chip light emitting device according to claim 1, wherein said end electrode of said light emitting chip and said terminal electrode of said substrate are directly connected through a conductive adhesive.

3. A chip light emitting device according to claim 1, wherein a package is formed on said main surface of said substrate in a manner covering said light emitting chip.

4. A chip light emitting device according to claim 3, wherein said device has a thickness of not greater than 0.5 mm between said back surface of said substrate and a top surface of said package.

5. A chip light emitting device according to claim 1, wherein said light emitting chip fixed on said substrate is in a rectangular parallelepiped form having a height of not greater than 0.2 mm with respect to said main surface of said substrate.

* * * * *